US009076675B2

(12) United States Patent
Hishida et al.

(10) Patent No.: US 9,076,675 B2
(45) Date of Patent: Jul. 7, 2015

(54) SEMICONDUCTOR MEMORY DEVICE WITH A 3-DIMENSIONAL STACKED MEMORY CELL STRUCTURE

(71) Applicant: Kabushiki Kaisha Toshiba, Minato-ku (JP)

(72) Inventors: Tomoo Hishida, Yokohama (JP); Yoshihisa Iwata, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/307,154

(22) Filed: Jun. 17, 2014

(65) Prior Publication Data

US 2014/0291798 A1 Oct. 2, 2014

Related U.S. Application Data

(63) Continuation of application No. 13/423,546, filed on Mar. 19, 2012, now Pat. No. 8,797,777.

(30) Foreign Application Priority Data

Jun. 28, 2011 (JP) .................................. 2011-143500

(51) Int. Cl.
| | | |
|---|---|---|
| G11C 5/02 | (2006.01) | |
| H01L 27/10 | (2006.01) | |
| G11C 5/06 | (2006.01) | |
| G11C 8/12 | (2006.01) | |
| G11C 7/18 | (2006.01) | |
| H01L 27/115 | (2006.01) | |

(Continued)

(52) U.S. Cl.
CPC ...... *H01L 27/10* (2013.01); *G11C 5/04* (2013.01); *G11C 5/025* (2013.01); *G11C 5/063* (2013.01); *G11C 8/12* (2013.01); *G11C 7/18* (2013.01);

(Continued)

(58) Field of Classification Search
CPC ........... G11C 5/025; G11C 5/04; G11C 5/063
USPC .................... 365/51, 185.17, 185.18, 185.05
See application file for complete search history.

(56) References Cited

U.S. PATENT DOCUMENTS 6,727,544 B2   4/2004   Endoh et al.
8,008,710 B2 *  8/2011   Fukuzumi et al. ............ 257/326

(Continued)

FOREIGN PATENT DOCUMENTS

JP   2002-299478 A   10/2002
JP   2007-180389 A   7/2007

(Continued)

OTHER PUBLICATIONS

Office Action issued Apr. 22, 2014 in Japanese Patent Application No. 2011-143500 filed Jun. 28, 2011 (with English Translation).

*Primary Examiner* — Connie Yoha
(74) *Attorney, Agent, or Firm* — Oblon, McClelland, Maier & Neustadt, L.L.P.

(57) ABSTRACT

A semiconductor memory device comprises: a semiconductor substrate; a plurality of memory units provided on the semiconductor substrate and each including a plurality of memory cells that are stacked; and a plurality of bit lines formed above each of a plurality of the memory units aligned in a column direction, an alignment pitch in a row direction of the plurality of bit lines being less than an alignment pitch in the row direction of the memory units, and an end of each of the memory units aligned in the column direction being connected to one of the plurality of bit lines formed above the plurality of the memory units aligned in the column direction.

20 Claims, 16 Drawing Sheets

(51) Int. Cl.
*G11C 16/04* (2006.01)
*G11C 5/04* (2006.01)

(52) U.S. Cl.
CPC ...... *H01L 27/11582* (2013.01); *G11C 16/0483* (2013.01); *G11C 2213/71* (2013.01)

(56) References Cited

U.S. PATENT DOCUMENTS

| | | | |
|---|---|---|---|
| 8,174,890 B2 * | 5/2012 | Maeda et al. | 365/185.17 |
| 8,295,091 B2 | 10/2012 | Itagaki et al. | |
| 8,334,551 B2 | 12/2012 | Itagaki et al. | |
| 8,358,539 B2 | 1/2013 | Maeda | |
| 2007/0252201 A1 | 11/2007 | Kito et al. | |
| 2014/0043915 A1 * | 2/2014 | Choi | 365/185.25 |
| 2014/0286099 A1 * | 9/2014 | Shirakawa | 365/185.12 |

FOREIGN PATENT DOCUMENTS

| | | |
|---|---|---|
| JP | 2007-200540 | 8/2007 |
| JP | 2007-266143 | 10/2007 |
| JP | 2010-187000 A | 8/2010 |
| JP | 2011-028833 A | 2/2011 |

* cited by examiner

SEMICONDUCTOR MEMORY DEVICE WITH A 3-DIMENSIONAL STACKED MEMORY CELL STRUCTURE

CROSS-REFERENCE TO RELATED APPLICATIONS

This application is a continuation of U.S. application Ser. No. 13/423,546 filed Mar. 19, 2012, and based upon and claims the benefit of priority from the prior Japanese Patent Application No. 2011-143500, filed on Jun. 28, 2011, the entire contents of each of which are incorporated herein by reference.

BACKGROUND

1. Field

The embodiments described herein relate to a semiconductor memory device and a method of control therein.

2. Description of the Related Art

In recent years, several semiconductor memory devices having memory cells disposed three-dimensionally (stacked type semiconductor memory devices) have been proposed to increase the degree of integration of memory.

In one known example of such a stacked type semiconductor memory device, a semiconductor pillar is formed extending in a perpendicular direction with respect to a semiconductor substrate, and word lines disposed in multiple layers in the perpendicular direction are connected to a side surface of that semiconductor pillar via a charge storage layer, thereby configuring a memory cell unit having memory cells connected in series in the perpendicular direction.

DETAILED DESCRIPTION

A semiconductor memory device according to an embodiment comprises: a semiconductor substrate; a plurality of memory units provided on the semiconductor substrate and each including a plurality of memory cells that are stacked; and a plurality of bit lines formed above each of a plurality of the memory units aligned in a column direction, an alignment pitch in a row direction of the plurality of bit lines being less than an alignment pitch in the row direction of the memory units, and an end of each of the memory units aligned in the column direction being connected to one of the plurality of bit lines formed above the plurality of the memory units aligned in the column direction. Embodiments are described below with reference to the accompanying drawings.

[First Embodiment]

[Overall Configuration]

Figure 1:
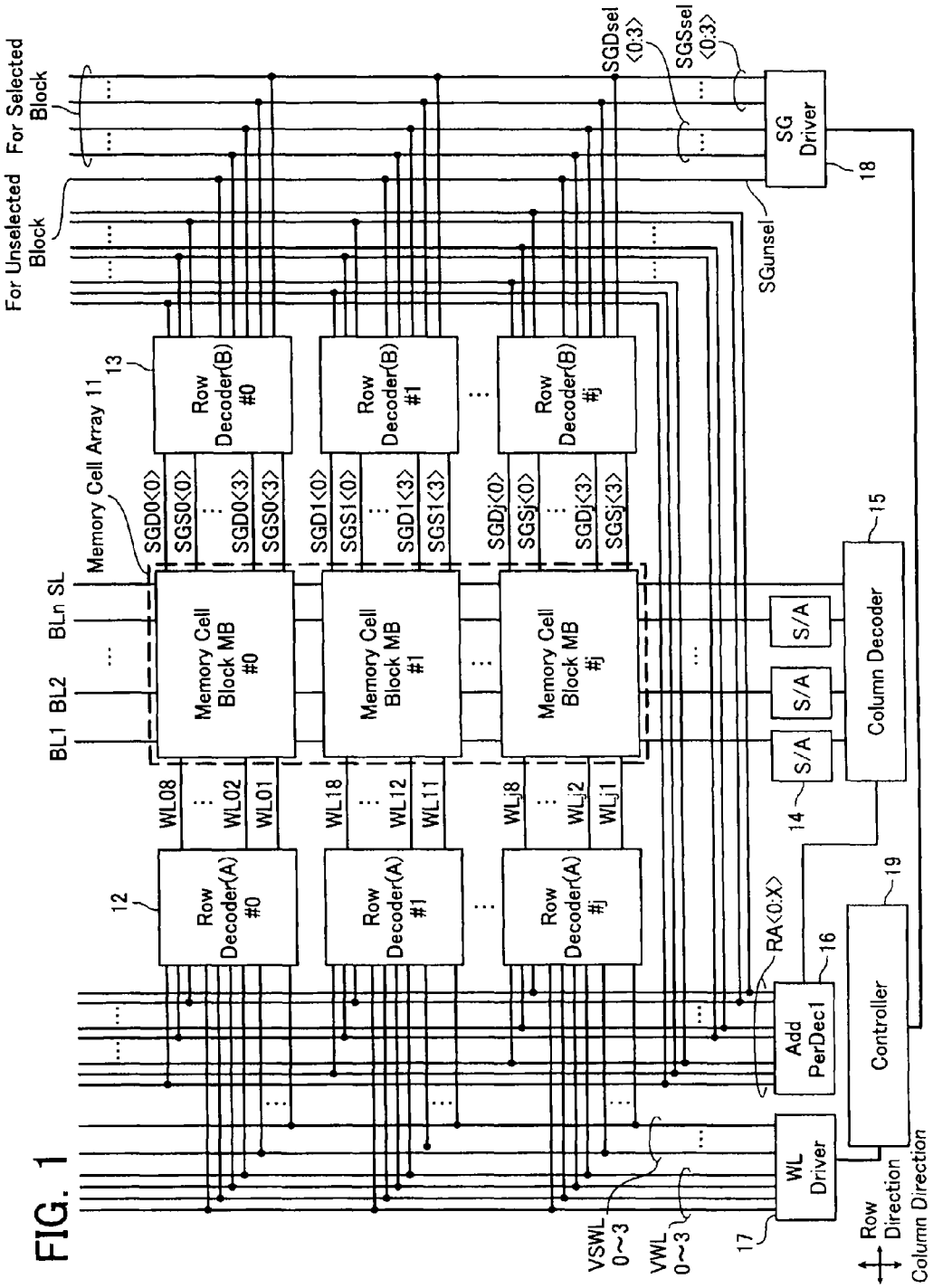
FIG. 1 is a block diagram showing a configuration of a semiconductor memory device according to a first embodiment.

First, an overall configuration of a semiconductor memory device according to a first embodiment is described with reference to FIG. 1. FIG. 1 is a block diagram showing the configuration of the semiconductor memory device according to the first embodiment.

As shown in FIG. 1, this semiconductor memory device includes a memory cell array 11 that comprises a plurality of memory blocks MB. The plurality of memory blocks MB#0-#j (where j is a natural number) are aligned in a column direction (direction in which a bit line BL extends). All the memory blocks MB#0-#j share bit lines BL and a source line SL. The plurality of memory blocks MB#0-#j, in addition to including a plurality of the bit lines BL extending in the column direction, include also a plurality of word lines WL and a plurality of select gate lines SGD and SGS extending in a row direction intersecting the bit lines BL. The word lines WL are connected to a row decoder 12, and the select gate lines SGD and SGS are connected to a row decoder 13. Moreover, the bit lines BL are connected to a column decoder 15 via a sense amplifier 14.

The row decoder 12 selects the word lines WL based on a row address outputted from an address pre-decoder 16, and applies a voltage generated by a word line driver 17 to, respectively, a selected word line and an unselected word line.

The row decoder 13 selects a source side select gate line SGS and a drain side select gate line SGD corresponding to a memory unit MU activated based on the row address outputted from the address pre-decoder 16, and applies a gate voltage generated by a select gate line driver 18 to a selected source side select gate line SGS and drain side select gate line SGD.

The column decoder 15 decodes a column address signal outputted from the address pre-decoder 16 and performs input/output control of data. The sense amplifier 14 senses and latches data of the bit line BL selected by the column decoder 15. A controller 19 receives a signal for executing a read/write/erase operation and so on, from an address command register not illustrated, and controls an internal voltage generating circuit not illustrated that generates various voltages required in core operation, according to a certain sequence. Note that a peripheral circuit of the row decoders 12 and 13, the sense amplifier 14, the column decoder 15, and so on, may be formed directly below the memory cell array 11.

[Memory Cell Array]

Figure 2:
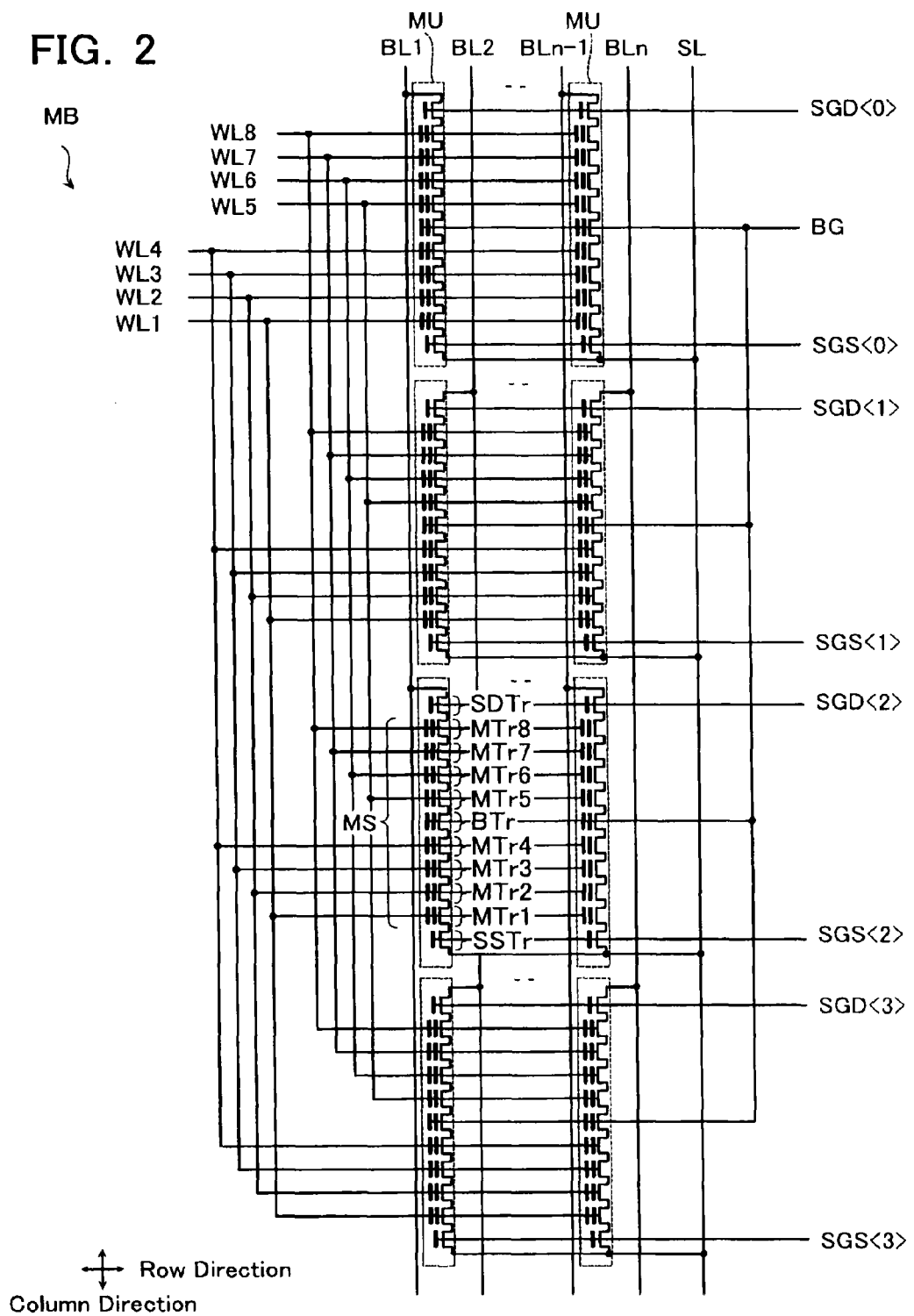
FIG. 2 is a circuit diagram of part of a memory cell array in the semiconductor memory device according to same embodiment.

Next, a configuration of the memory cell array 11 is described with reference to FIGS. 2-7. FIG. 2 is a circuit diagram showing part of one memory block MB in the memory cell array 11.

As shown in FIG. 2, the memory block MB includes a plurality of memory units MU arranged in a matrix. One ends of the memory units MU arranged in the column direction are connected alternately to two bit lines BLj and BLj+1 disposed along these memory units MU. The other ends of the memory units MU are commonly connected to the source line SL.

Each of the memory units MU includes a memory string MS, and a source side select transistor SSTr and drain side select transistor SDTr provided at the two ends of the memory string MS. The memory string MS herein, which comprises, connected in series, a plurality of memory transistors MTr1-MTr8 and a back gate transistor BTr connected between the memory transistors MTr4 and MTr5, is configured having the source side select transistor SSTr and the drain side select transistor SDTr connected respectively to the two ends of the memory string MS. The memory transistors MTr1-MTr8 each have a MONOS structure, for example, that includes: a charge storage layer (for example, an insulating film) formed on a side surface of a semiconductor layer via a gate insulating film; an insulating film (insulating film having a higher permittivity than the charge storage layer) formed on a side surface of the charge storage layer; and a control gate formed on a side surface of this insulating film. The memory transistors MTr1-MTr8 each change their threshold voltage by storing a charge in their charge storage layer and thereby store information corresponding to this threshold voltage.

In the memory block MB, gates of memory transistors MTrj aligned in the row direction are commonly connected to a word line WLj extending in the row direction. In addition, in one memory block MB, word lines WLj connected to corresponding memory transistors MTrj in each of the memory units MU are commonly connected. Moreover, gates of back gate transistors BTr in the memory units MU are commonly connected to the back gate line BG.

In the memory block MB, gates of each of the drain side select transistors SDTr aligned in the row direction are commonly connected to the drain side select gate line SGD extending in the row direction. Moreover, in the memory block MB, gates of each of the source side select transistors SSTr aligned in the row direction are commonly connected to the source side select gate line SGS extending in the row direction.

Next, a structure of the memory cell array 11 according to the first embodiment is described with reference to FIGS. 3-7.

Figure 3:
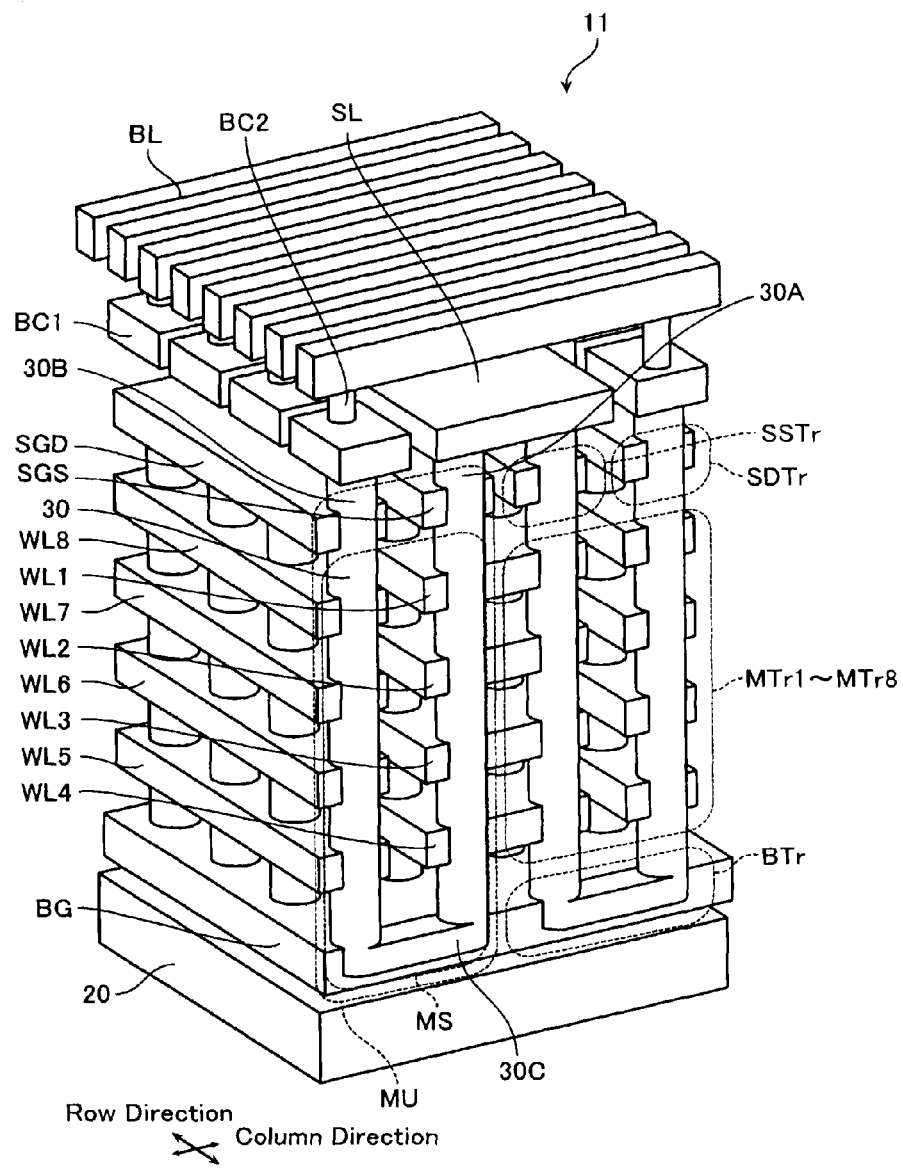
FIG. 3 is a perspective view of part of the memory cell array in the semiconductor memory device according to same embodiment.
Figure 4:
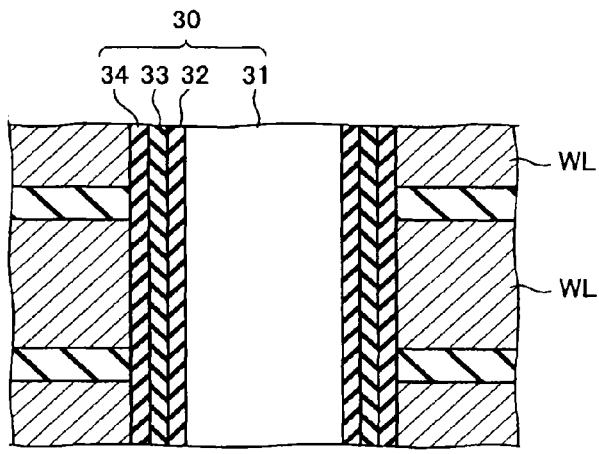
FIG. 4 is a cross-sectional view of part of the memory cell array in the semiconductor memory device according to same embodiment.

FIG. 3 is a perspective view showing a configuration of part of the memory cell array 11.

As shown in FIG. 3, the memory cell array 11 comprises a U-shaped columnar semiconductor layer 30 having both ends (source end and drain end) of the back gate transistor BTr extending upwardly in a perpendicular direction on a semiconductor substrate 20. The semiconductor layer 30 is disposed having its both ends (upper ends) aligned in the column direction, and is disposed in a plural matrix in the column direction and the row direction. As shown in an enlarged view of part of a cross-section of the semiconductor layer 30 in FIG. 4, the semiconductor layer 30 is configured by a columnar semiconductor body 31, a tunnel insulating layer 32 covering a side surface of the semiconductor body 31, a charge storage layer 33, and a block insulating layer 34. Employable as the tunnel insulating layer 32 and the block insulating layer 34 is, for example, silicon oxide ($SiO_2$) or the like. Employable as the charge storage layer 33 is, for example, silicon nitride (SiN) or the like.

A back gate BG is disposed on the semiconductor substrate 20. The back gate transistor BTr is formed by this back gate BG and a folded part of the semiconductor layer 30. The folded part herein is described using FIG. 3. The semiconductor layer 30 includes a first columnar portion 30A, a second columnar portion 30B, and a folded portion 30C. The folded part refers to this 30C in FIG. 3.

Stacked around the first columnar portion 30A on one side, via insulating layers, in order from the semiconductor substrate 20 side in an upwardly perpendicular direction, are conductive layers forming the word lines WL4, WL3, WL2, WL1, and the source side select gate line SGS. These conductive layers are connected to a side surface of the semiconductor layer 30. Stacked around the second columnar portion 30B on the other side, via insulating layers, in order from the semiconductor substrate 20 side in an upwardly perpendicular direction, are conductive layers forming the word lines WL5, WL6, WL7, WL8, and the drain side select gate line SGD. These conductive layers are connected to a side surface of the semiconductor layer 30. As a result, the memory transistors MTr1-8 are configured having the word lines WL1-8 as control gates, and the U-shaped semiconductor body 31 as a channel body. In addition, the source side select gate line SGS, the drain side select gate line SGD, and the back gate BG have the U-shaped semiconductor layer 30 as a body to configure, respectively, the source side select gate transistor SSTr, the drain side select gate transistor SDTr, and the back gate transistor BTr.

That is, the memory transistors MTr1-8 and the back gate transistor BTr configure the memory string MS, having a stacking direction as a long direction. Moreover, the memory string MS, the drain side select gate transistor SDTr, and the source side select gate transistor SSTr configure the memory unit MU. A source side of the memory unit MU, that is, one of the ends of the semiconductor layer 30, is connected to the source line SL. A drain side of the memory unit MU, that is, the other of the ends of the semiconductor layer 30, is connected to the bit line BL via bit line contacts BC1 and BC2. The bit line BL and the bit line contact BC2 are configured thinner than the semiconductor layer 30, and, in this example, a width of the bit line BL and a width of the bit line contact BC2 are substantively equal.

Figure 5:
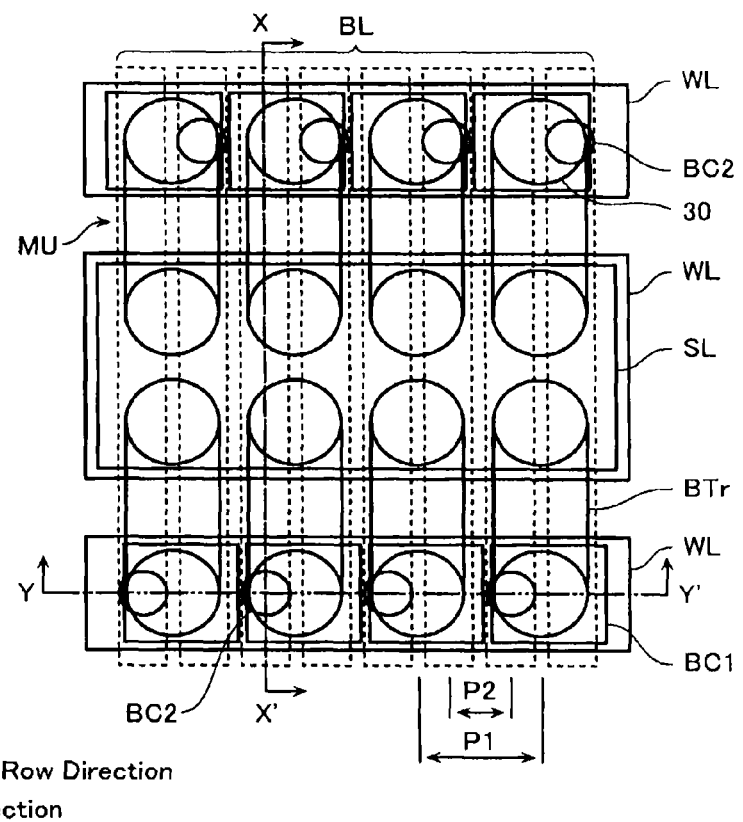
FIG. 5 is a plan view of part of the memory cell array in the semiconductor memory device according to same embodiment.
Figure 6:
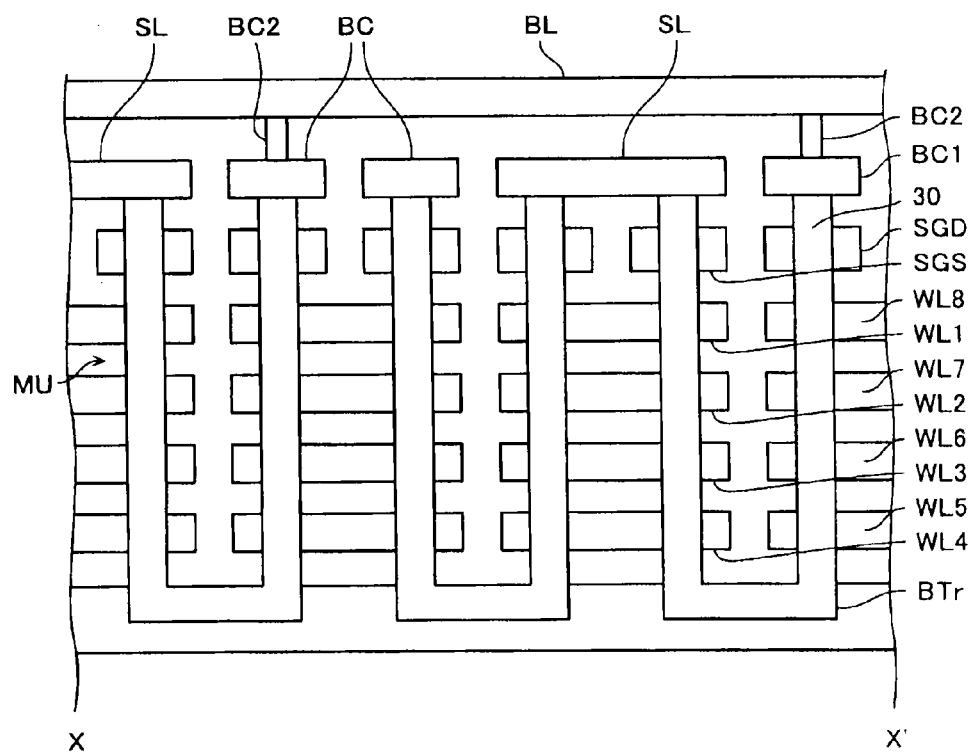
FIG. 6 is a cross-sectional view of part of the memory cell array in the semiconductor memory device according to same embodiment.
Figure 7:
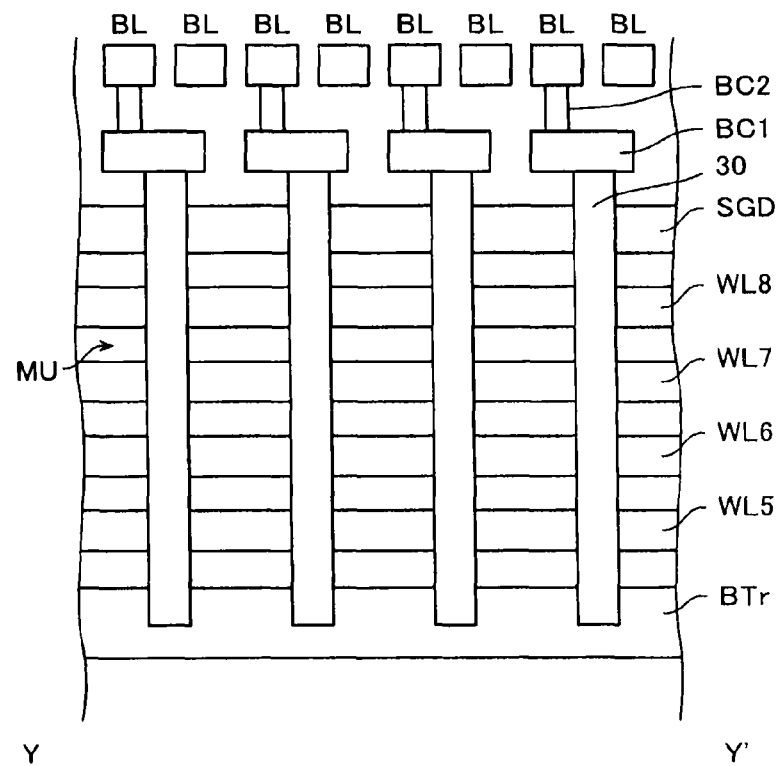
FIG. 7 is a cross-sectional view of part of the memory cell array in the semiconductor memory device according to same embodiment.

FIG. 5 is a plan view of the memory cell array 11, and FIGS. 6 and 7 are cross-sectional views taken along the lines X-X' and Y-Y', respectively, of FIG. 5. As shown in FIG. 5, in the semiconductor memory device according to the present embodiment, the bit lines BL are arranged in the row direction with a pitch P2 which is half of a pitch P1 of the memory units MU in the row direction. Moreover, memory units MU adjacent in the column direction are connected respectively to different bit lines BL. Therefore, two lines each of bit lines BL are extended respectively from one column group of memory units MU aligned in the column direction.

Figure 8:
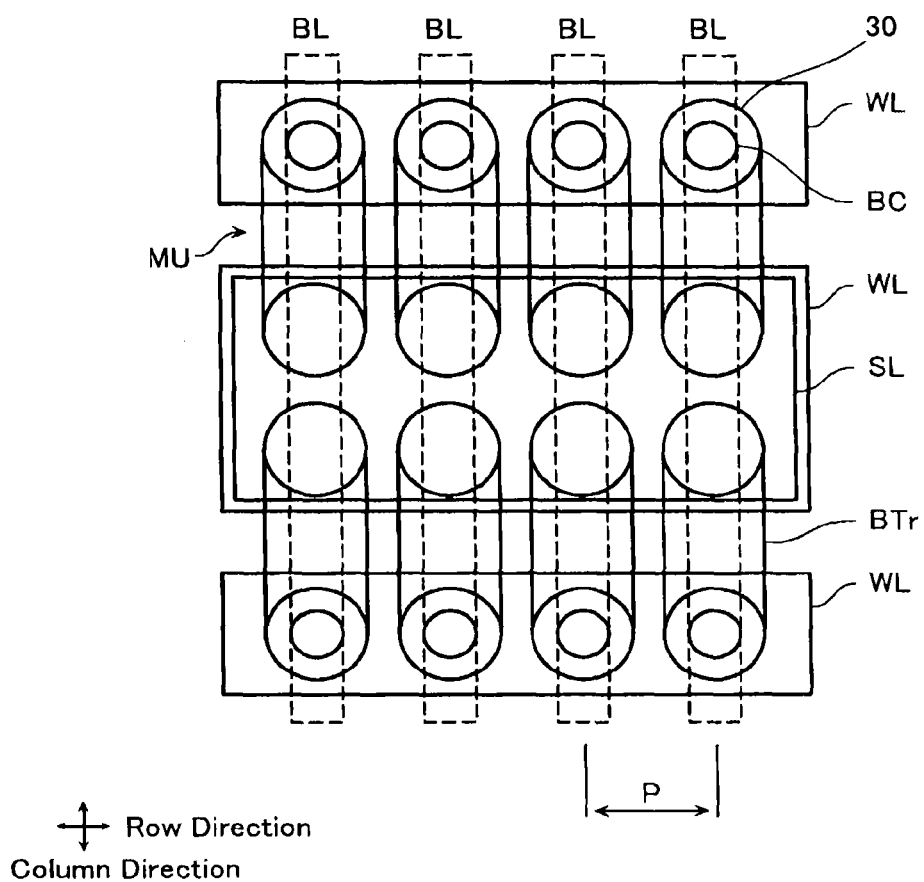
FIG. 8 is a plan view of part of a memory cell array in a semiconductor memory device according to a comparative example.

As a comparative example, FIG. 8 shows a plan view of a general semiconductor memory device. In the comparative example, a pitch in the row direction of the bit lines BL and the memory units MU is configured equal.

The memory unit MU has a memory hole formed deeply in the stacking direction and has the semiconductor layer 30 formed having a charge storage layer and insulating layer formed on its surface, hence miniaturization is not as easy as for the bit line BL. In contrast, the bit line BL can be lithographed by simple line-and-spacing, hence further miniaturization is easy by, for example, a sidewall transfer process. Specifically, the bit line BL can be formed with a width of about 1/n times the width of the semiconductor layer (where n is a natural number).

Focusing on this point, as shown in FIG. 5, the semiconductor memory device according to the present embodiment is configured having two lines of bit lines allocated to one column group of memory units MU aligned in the column direction.

More specifically, as shown in FIGS. 5-7, the bit line contact BC1 is connected to an end of the semiconductor layer 30. A cross-section of this bit line contact BC1 is larger than a cross-section of the semiconductor layer 30. A width in the row direction of the bit line contact BC1 is about the same as a width of two bit lines. Further, the bit line BL to which the memory units MU adjacent in the column direction are connected via the bit line contact BC2 differs for every other one of the memory units MU. Specifically, a certain memory unit MU is connected to one of the two bit lines BL formed above the bit line contact BC1. The memory unit MU adjacent to this memory unit MU in the column direction is connected to the other of the bit lines BL. To achieve such a method of connection, fellow bit line contacts BC2 adjacent in the column direction are connected respectively to different bit lines BL.

[Peripheral Circuit]

Figure 9:
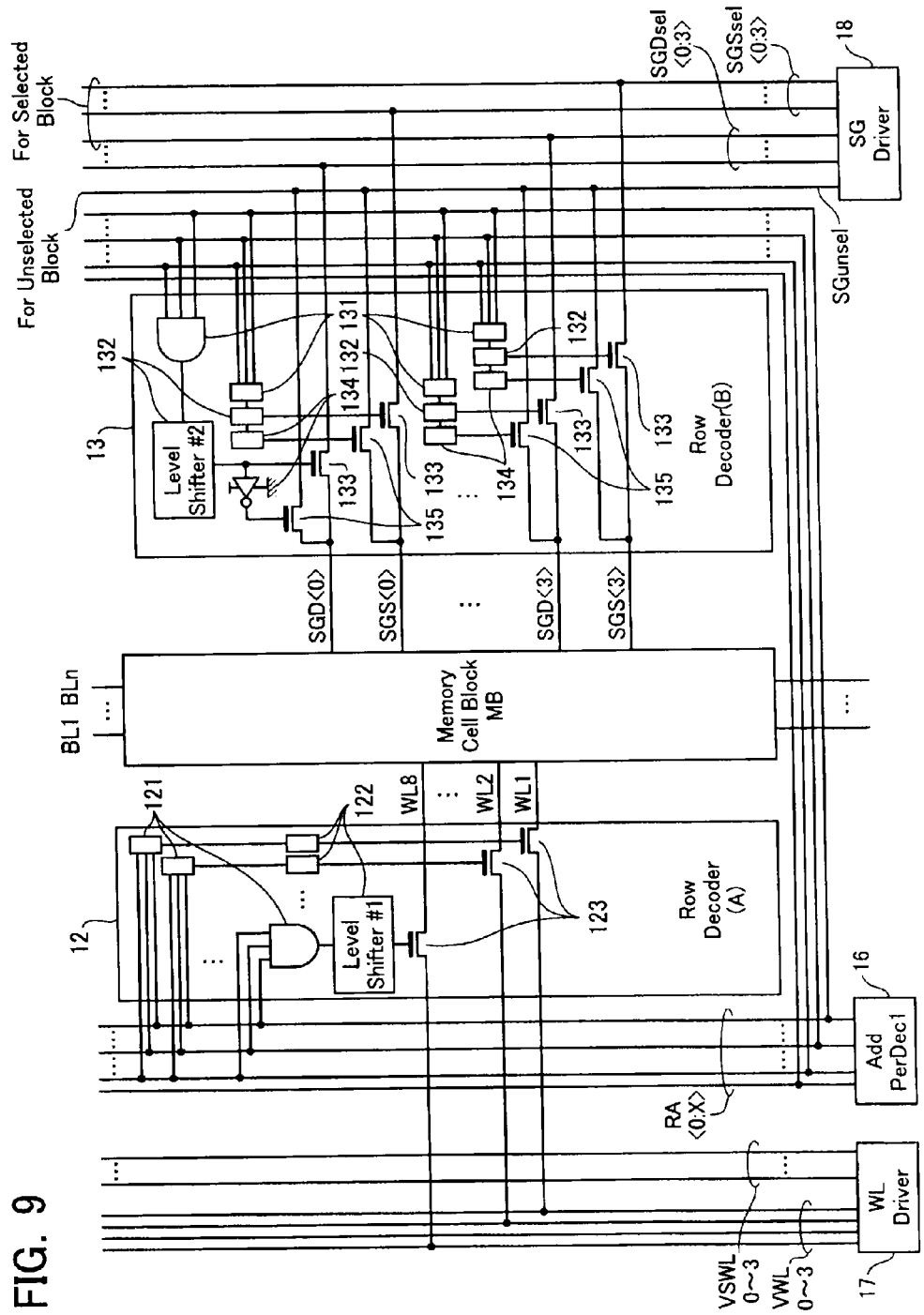
FIG. 9 is a circuit diagram of a peripheral circuit in the semiconductor memory device according to the first embodiment.

Next, configurations of the row decoders 12 and 13 in the semiconductor memory device according to the present embodiment are described with reference to FIG. 9. FIG. 9 is a circuit diagram for explaining the configuration of the row decoders 12 and 13 in the semiconductor memory device according to the present embodiment.

The row decoder 12 comprises: an address decoding circuit 121 for selecting a certain word line according to a row address outputted from the address pre-decoder 16; a level shifter 122 that generates a voltage on receiving input of a signal from the address decoding circuit 121; and a select transistor 123 that, on receiving input to its gate of the voltage outputted from the level shifter 122, outputs to the selected word line WL a voltage inputted from the word line driver 17.

The row decoder 13 comprises an address decoding circuit 131, a level shifter 132, and a select transistor 133 similar to those in the row decoder 12, and further comprises: an inverter 134 for inverting a voltage outputted from the level shifter 132; and a select transistor 135 that receives input to its gate of a signal from the inverter 134.

The configuration of the row decoder 13 is basically similar to that of the row decoder 12, but differs in that the select transistors 135 and 133 cause a select gate line to be connected to one of either unselected block wiring SGunsel or selected block wiring SGSsel or SGDsel.

In the present embodiment, the row decoder 13 allows the select transistors SDTr and SSTr in memory units MU adjacent in the column direction to be simultaneously selected. As a result, data can be simultaneously accessed from memory units MU in FIG. 2 adjacent in the column direction via different bit lines BL. Therefore, the number of bits in one page worth of data able to be read or written in one go can be doubled compared to the comparative example shown in FIG. 8.

In such a way, the present embodiment allows the page length capable of being read or written in a single read operation to be increased without increasing circuit area. This results in performance of the semiconductor memory device according to the present embodiment being improved.

Note that since the bit lines BL are connected to the sense amplifier 14, there is a risk that increasing the number of bit lines leads to an increase in circuit area. However, the semiconductor memory device according to the present embodiment is a semiconductor memory device of the so-called Pipe type employing the U-shaped semiconductor layer 30 as a channel body of the memory string MS. Hence, it is possible to bring the wiring together above the memory cell array 11 and form the sense amplifier 14 under the memory cell array 11. Therefore, circuit area is determined by area of the memory cell array 11, and it can be prevented that circuit area increases to be larger than area of the memory cell array 11.

[Second Embodiment]

Figure 10:
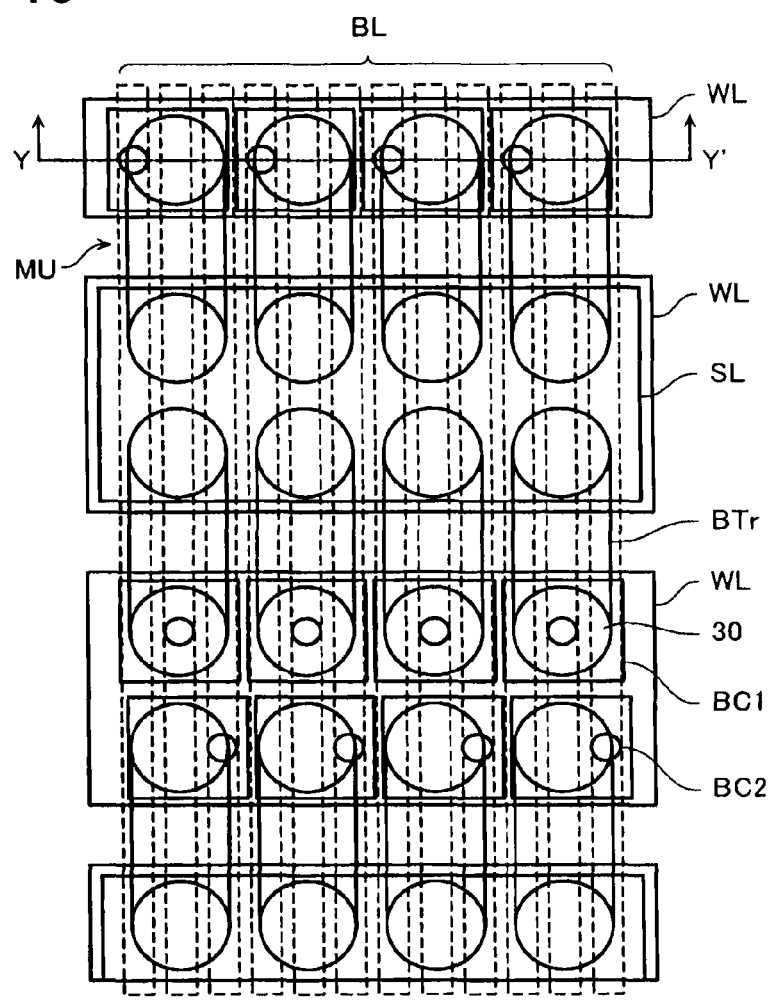
FIG. 10 is a plan view of part of a memory cell array in a semiconductor memory device according to a second embodiment.
Figure 11:
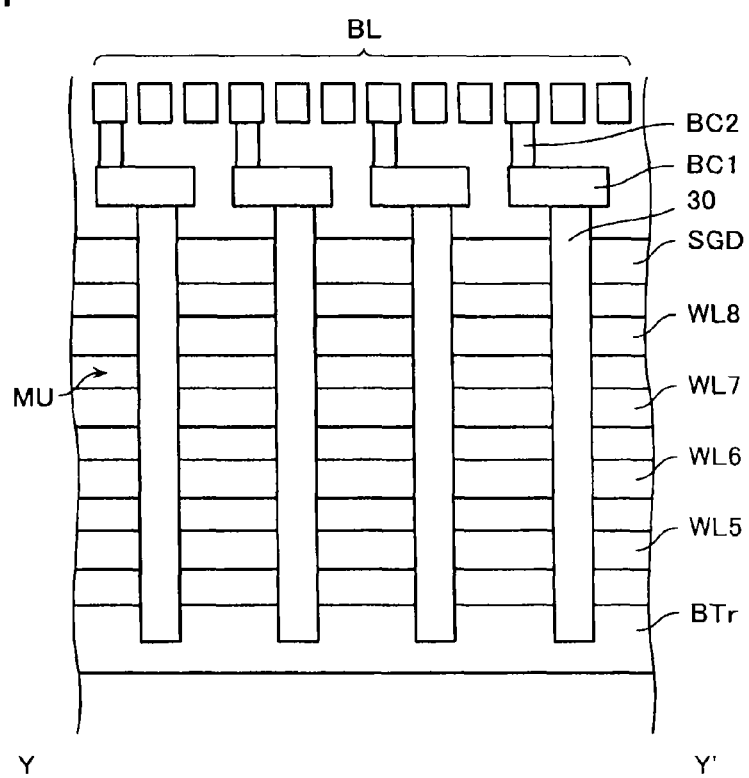
FIG. 11 is a cross-sectional view of part of the memory cell array in the semiconductor memory device according to same embodiment.
Figure 12:
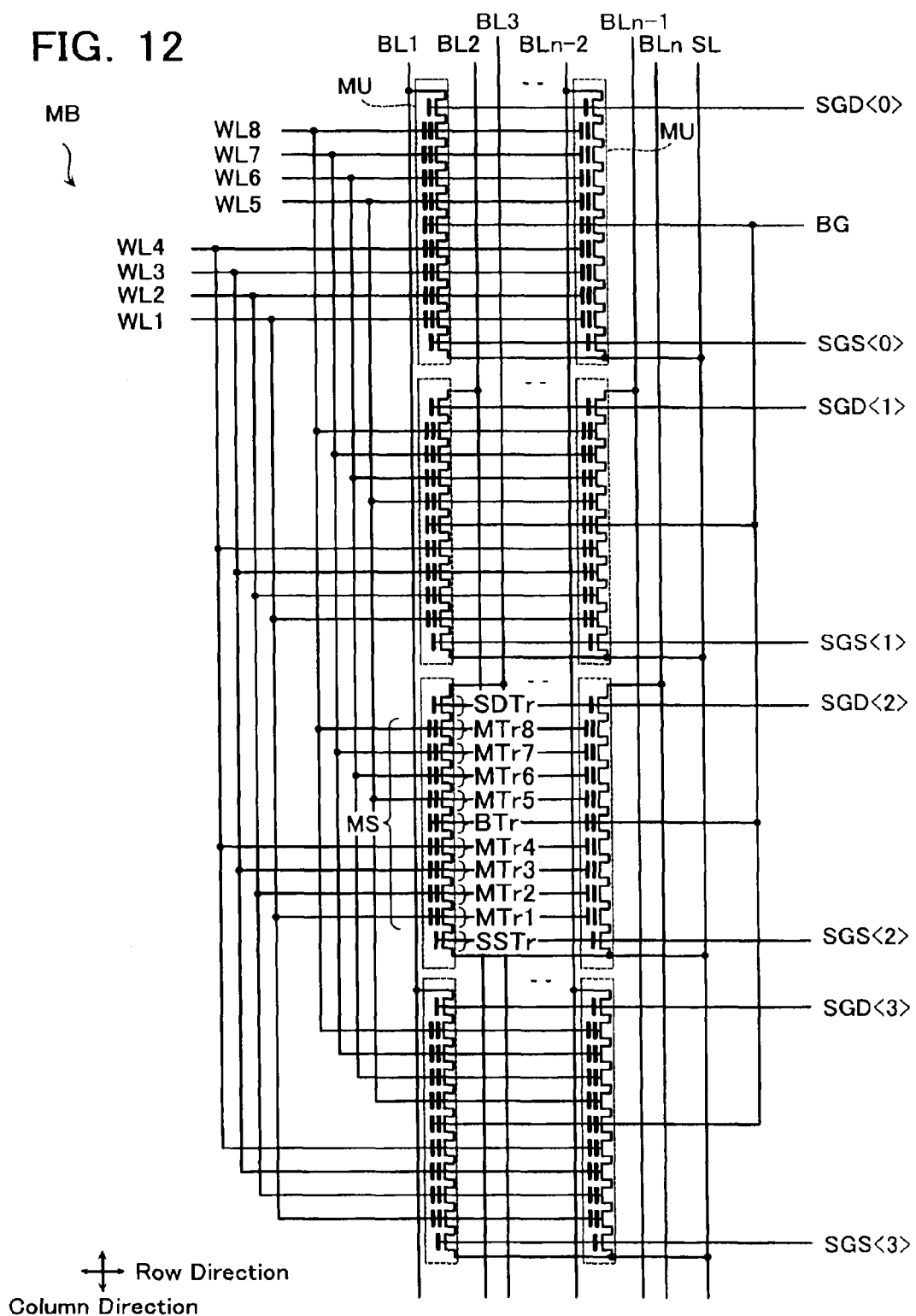
FIG. 12 is a circuit diagram of part of the memory cell array in the semiconductor memory device according to same embodiment.

Next, a configuration of a memory cell array 11 according to a second embodiment is described with reference to FIGS. 10-12. FIG. 10 is a plan view showing a configuration of part of the memory cell array; FIG. 11 is a cross-sectional view taken along the line Y-Y' of the plan view shown in FIG. 10; and FIG. 12 is a circuit diagram showing a configuration of part of the memory cell array. Note that identical symbols are assigned to configurations identical to those in the first embodiment, and descriptions thereof are omitted.

In the first embodiment, the bit lines BL are arranged with a pitch half (½) that of the memory units MU, but in the present embodiment, the bit lines BL are arranged with a pitch a third (⅓) that of the memory units MU. In addition, the bit lines BL are connected to every second memory string aligned in the bit line BL direction. That is, when m is assumed to be a natural number, a 3m-th one of the memory units MU aligned in the bit line BL direction is connected to the bit line BL1, a (3m+1)-th one of the memory units MU aligned in the bit line BL direction is connected to the bit line BL2, and a (3m+2)-th one of the memory units MU aligned in the bit line BL direction is connected to the bit line BL3.

Such a configuration causes page length to become 1.5 times larger than that in the first embodiment, and three times larger than that in a conventional device, thereby allowing read/write speed to be further improved.

Note that in the present embodiment, the bit lines BL are arranged with a pitch a third (⅓) that of the memory units MU, but the present invention is not limited to this configuration, and the bit lines BL may be arranged with a pitch that is any integer fraction that of the memory strings MS. Moreover, bit lines BL having an integer fraction pitch may also be arranged in some of the memory units MU only.

[Third Embodiment]

Figure 13:
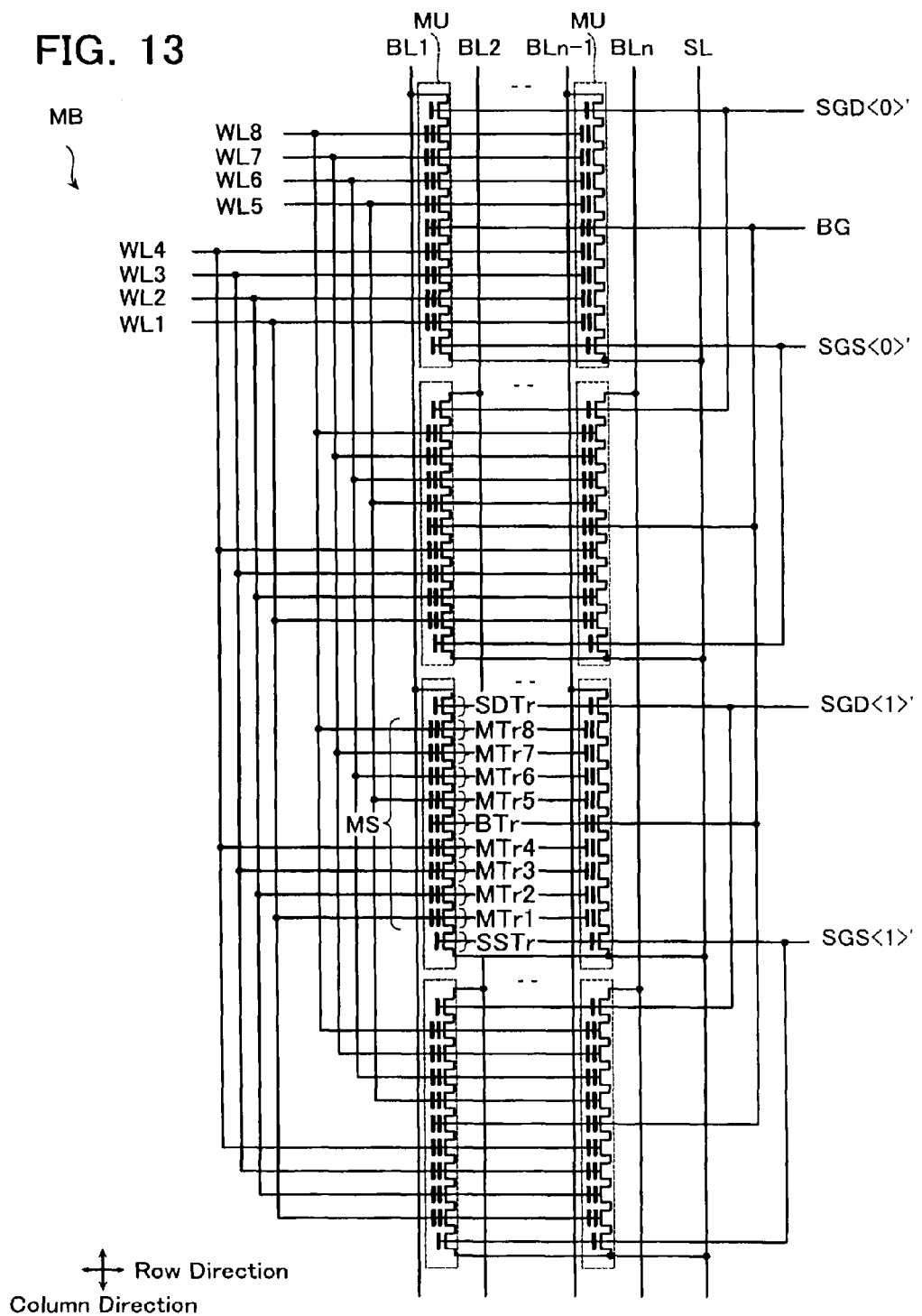
FIG. 13 is a circuit diagram of part of a memory cell array in a semiconductor memory device according to a third embodiment.
Figure 14:
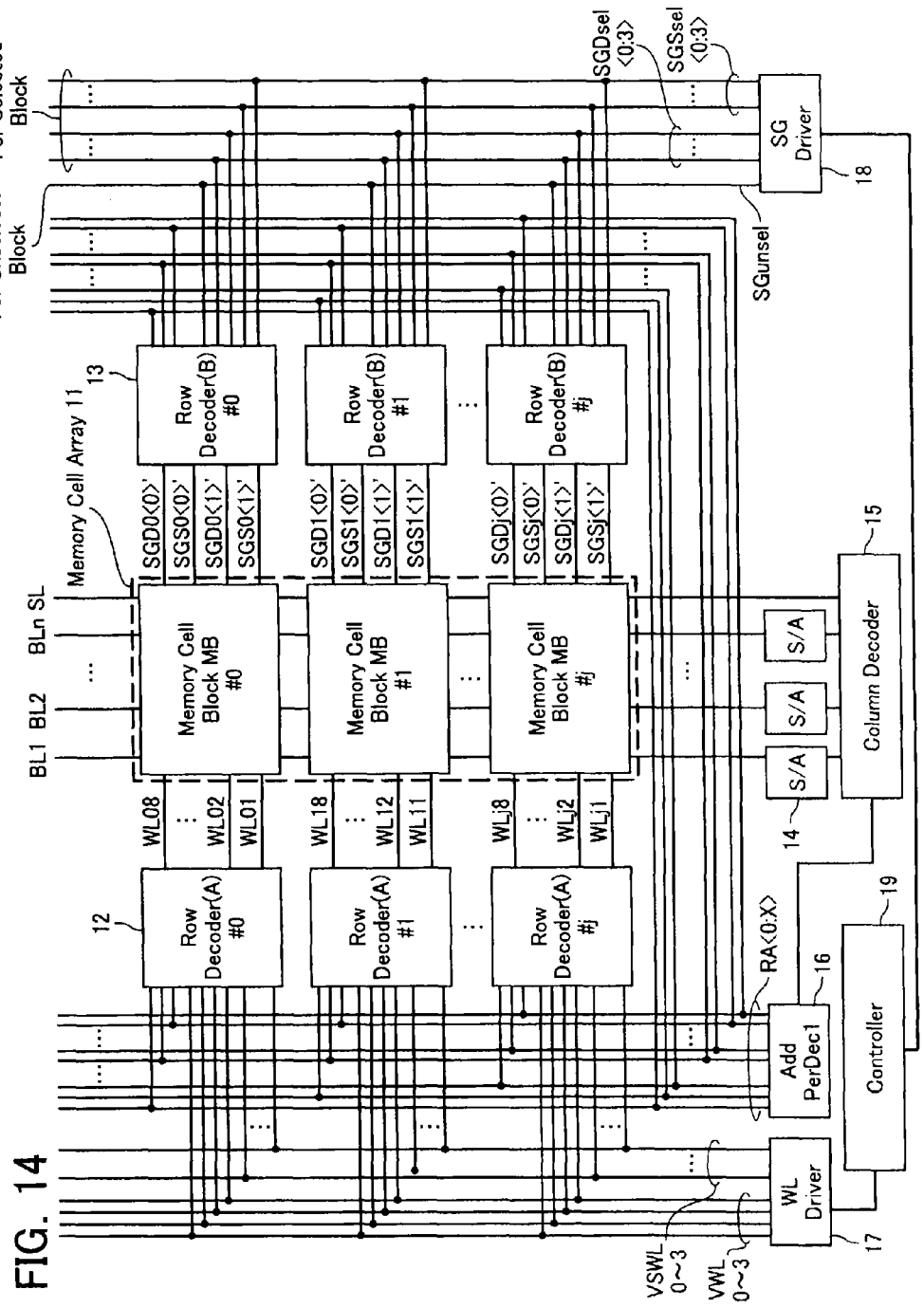
FIG. 14 is a block diagram showing a configuration of the semiconductor memory device according to same embodiment.

Next, a semiconductor memory device according to a third embodiment is described with reference to FIGS. 13-15. FIG. 13 is a circuit diagram showing a configuration of part of a memory cell array 11 in the semiconductor memory device according to the present embodiment; FIG. 14 is a block diagram showing overall configuration; and FIG. 15 is circuit diagram showing a configuration of a peripheral circuit.

In the first embodiment, select gate lines SGS and SGD are independently connected to gates of the select gate transistors SSTr and SDTr, respectively, in a plurality of memory units MU adjacent in the column direction. In the present embodiment, as shown in FIG. 13, the memory units MU adjacent in the column direction configure pairs, and a select gate line SGS and SGD are commonly connected to the two memory units MU configuring such a pair.

Specifically, for example, the drain side select gate lines SGD<0> and SGD<1> in the first embodiment shown in FIG. 2 are commonly connected in the third embodiment to configure a drain side select gate line SGD<0>'. Similarly, the source side select gate lines SGS<0> and SGS<1> in the first embodiment shown in FIG. 2 are commonly connected in the third embodiment to configure a source side select gate line SGS<0>' in the present embodiment.

Figure 15:
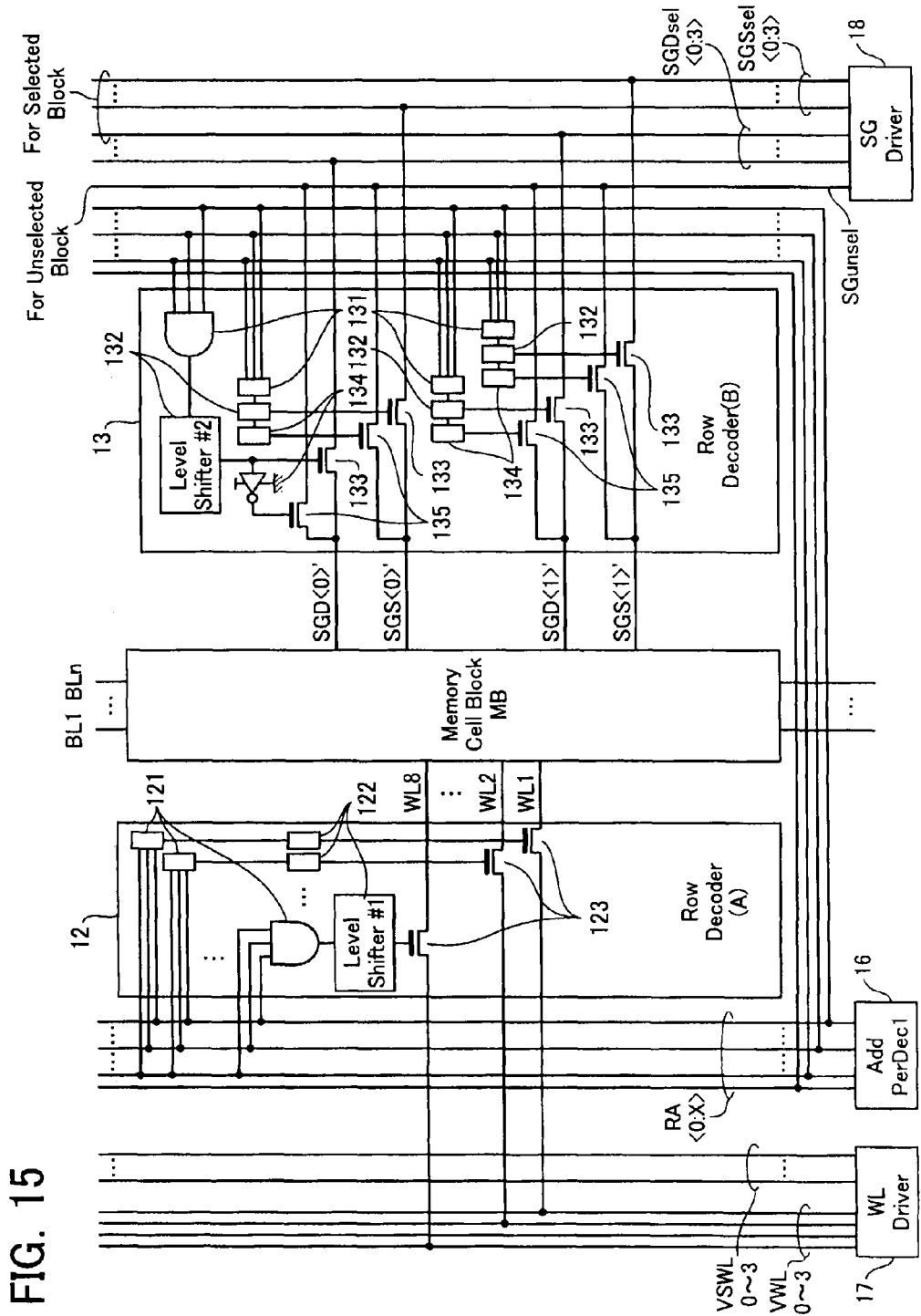
FIG. 15 is a block diagram showing a configuration of part of a peripheral circuit in the semiconductor memory device according to same embodiment.

As shown in FIGS. 14 and 15, such a configuration enables the number of select gate lines connecting the memory cell array 11 and the row decoder 13 to be halved. Moreover, as shown in FIG. 15, reducing the number of select gate lines also allows circuit area of the row decoder 13 to be suppressed to half (½).

Such a configuration is made possible by having the memory units MU adjacent in the column direction connected respectively to different bit lines BL. Therefore, when the bit lines BL are disposed with a pitch a third (⅓) that of the memory units MU as in the second embodiment, three select gate lines may be commonly connected. That is, how many select gate lines are commonly connected may be determined appropriately by a dispositional relationship of the memory units MU and bit lines BL.

[Fourth Embodiment]

Figure 16:
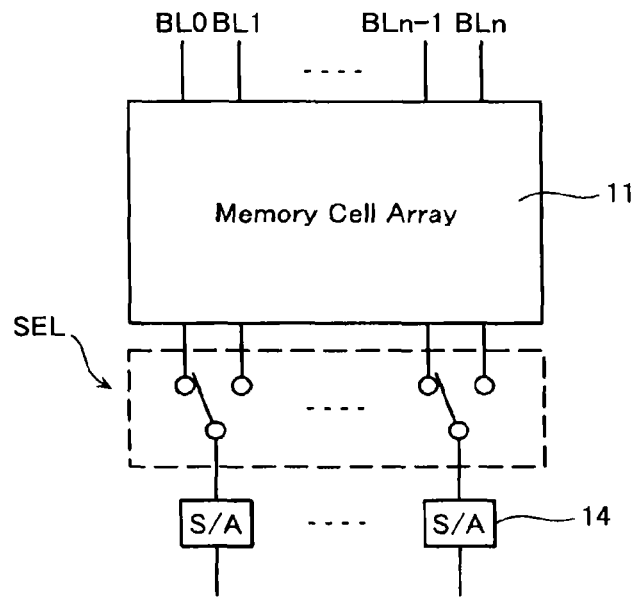
FIG. 16 is a block diagram showing a schematic configuration of a semiconductor memory device according to a fourth embodiment.

Next, a fourth embodiment is described with reference to FIG. 16. FIG. 16 is a block diagram showing a schematic configuration of the semiconductor memory device according to the present embodiment.

In the present embodiment, two lines of bit lines BL are allocated to one column group of memory units MU aligned in the column direction, similarly to in the first embodiment, but the same number of sense amplifiers are provided as there are column groups of memory units MU. In this case, since one sense amplifier 14 is used alternately by two lines of bit lines BL, a selecting circuit SEL is provided between the bit lines BL and the sense amplifier 14.

In the case of this embodiment, area of the sense amplifier can be suppressed to an area similar to that in a conventional device. In order to read or write data alternately to adjacent bit lines, each of the memory units MU is independently supplied with, respectively, select gate lines SGS and SGD.

[Fifth Embodiment]

Figure 17:
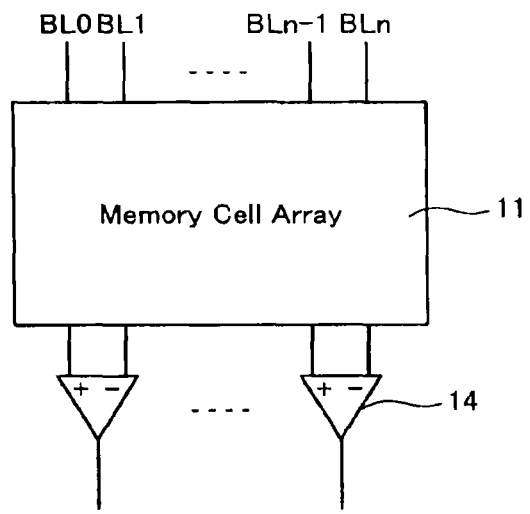
FIG. 17 is a block diagram showing a schematic configuration of a semiconductor memory device according to a fifth embodiment.

FIG. 17 is a block diagram showing a schematic configuration of a semiconductor memory device according to a fifth embodiment. A basic configuration of the present embodiment is similar to that of the first embodiment, but differs in that a differential type sense amplifier is used as the sense amplifier 14. In the present embodiment, a pair cell is configured by a pair of corresponding memory transistors MTr in memory units MU adjacent in the column direction, and this pair cell stores data that differs logically one from another. In this case, a pair of data is read from adjacent bit lines BL and differential detection is performed by the sense amplifier 14.

This embodiment allows configuration of a memory resistant to noise, disturbance, and the like.

[Sixth Embodiment]

Figure 18:
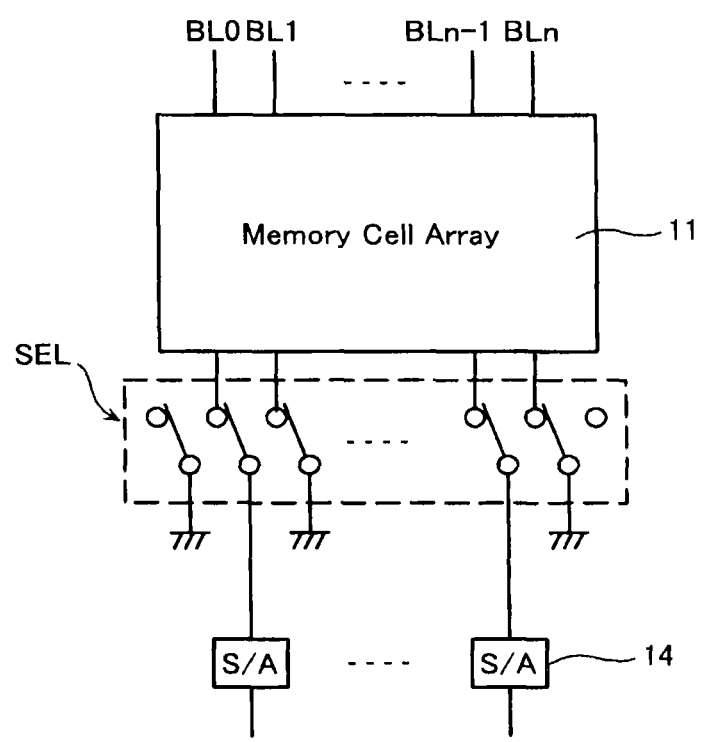
FIG. 18 is a block diagram showing a schematic configuration of a semi conductor memory device according to a sixth embodiment.

FIG. 18 is a block diagram showing a schematic configuration of a semiconductor memory device according to a sixth embodiment. In the present embodiment, one of two bit lines BL is connected to the sense amplifier 14, and the other of the two bit lines BL is grounded and used as a shield line.

The present embodiment, while setting the number of bits of a page that are read at one time to be the same as in a conventional device, allows every other bit line BL to be used as a shield, hence enables even greater stability of data read to be achieved.

Note that the above-described embodiments 1-6 relate to a Pipe type semiconductor memory device, but the present invention may of course also be applied to an I type semiconductor memory device using a pillar semiconductor as a channel body of the memory unit MU. Circuit configurations and so on indicated in the embodiments described above may of course also be changed.

[Other]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a semiconductor substrate;
    memory units including memory cells that are stacked above the semiconductor substrate, the memory units including a first memory unit and a second memory unit, the second memory unit being adjacent to the first memory unit in a first direction; and
    bit lines disposed above the memory units, the bit lines extending in a second direction across the first direction, the bit lines including a first bit line and a second bit line, the second bit line being adjacent to the first bit line in the first direction, wherein
    a first pitch is larger than a second pitch, the first pitch being a pitch between the first memory unit and the second memory unit, the second pitch being a pitch between the first bit line and the second bit line.

2. The semiconductor memory device according to claim 1, wherein
    the bit lines include more than n bit lines and are disposed such that the second pitch is 1/n times the first pitch (n being a natural number),
    n bit lines are allocated to one column group of the memory units, and
    the n bit lines are electrically connected to n memory units.

3. The semiconductor memory device according to claim 1, wherein one of the memory units comprises:
    a semiconductor body extending in a direction perpendicular to the semiconductor substrate;
    a charge storage layer surrounding the semiconductor body; and
    word lines surrounding the charge storage layer.

4. The semiconductor memory device according to claim 2, wherein
    a read or write operation is performed to the memory cells in the n memory units electrically connected to the n bit lines simultaneously.

5. The semiconductor memory device according to claim 3, wherein
a width of the bit line in the first direction is smaller than a width of the semiconductor body in the first direction, and
the semiconductor body and the bit line are connected via a first bit line contact, the first bit line contact having a width smaller than a width of the semiconductor body in the first direction.

6. The semiconductor memory device according to claim 2, further comprising:
a sense amplifier connected selectively or simultaneously to the n bit lines.

7. The semiconductor memory device according to claim 6, wherein
a differential type sense amplifier is used as the sense amplifier.

8. The semiconductor memory device according to claim 6, wherein
the sense amplifier is connected electrically to the first bit line among the n bit lines in which a read or write operation is performed, and the second bit line among the n bit lines other than the first bit line in which the read or write operation is performed is employed as a shield line.

9. The semiconductor memory device according to claim 1, wherein
the memory units are electrically connected to the bit line.

10. A semiconductor memory device, comprising:
a semiconductor substrate;
memory units including memory cells that are stacked above the semiconductor substrate, the memory units including a first memory unit, a second memory unit, and a third memory unit, the second memory unit being adjacent to the first memory unit along a first line, the third memory unit being adjacent to the first memory unit along a second line across the first line;
bit lines disposed above the memory units, the bit lines extending in a second direction, the bit lines including a first bit line, a second bit line, a third bit line, and a fourth bit line, the first bit line being electrically connected to the first memory unit, the second bit line being electrically connected to the second memory unit, the third bit line being electrically connected to the third memory unit and disposed between the first bit line and the second bit line, the fourth bit line being disposed between the third bit line and the second bit line.

11. The semiconductor memory device according to claim 10, wherein
a first pitch is larger than a second pitch, the first pitch being a pitch between the first memory unit and the second memory unit, the second pitch being a pitch between the first bit line and the third bit line.

12. The semiconductor memory device according to claim 10, wherein one of the memory units comprises:
a semiconductor body extending in a direction across the semiconductor substrate;
a charge storage layer surrounding the semiconductor body; and
word lines surrounding the charge storage layer.

13. The semiconductor memory device according to claim 10, wherein
the memory units further include a fourth memory unit, the fourth memory unit being adjacent to the third memory unit along a third line parallel to the first line,
the bit lines further include a fifth bit line, the fifth bit line being electrically connected to the fourth memory unit.

14. The semiconductor memory device according to claim 13, wherein
the fifth bit line is located adjacent to the second bit line on an opposite side of the second bit line with respect to the fourth bit line.

15. The semiconductor memory device according to claim 11, wherein
the bit lines include more than n bit lines and are disposed such that the second pitch is 1/n times the first pitch (n being a natural number),
n bit lines are allocated to one column group of the memory units, and
the n bit lines are electrically connected to n memory units.

16. The semiconductor memory device according to claim 15, wherein
a read or write operation is performed to the memory cells in the n memory units electrically connected to the n bit lines simultaneously.

17. The semiconductor memory device according to claim 15, further comprising:
a sense amplifier connected selectively or simultaneously to the n bit lines.

18. The semiconductor memory device according to claim 17, wherein
a differential type sense amplifier is used as the sense amplifier.

19. The semiconductor memory device according to claim 17, wherein
the sense amplifier is connected electrically to the first bit line among the n bit lines in which a read or write operation is performed, and the second bit line among the n bit lines other than the first bit line in which the read or write operation is performed is employed as a shield line.

20. The semiconductor memory device according to claim 10, wherein
the memory units are electrically connected to the bit line.

* * * * *